(12) United States Patent
Shi et al.

(10) Patent No.: US 10,886,382 B2
(45) Date of Patent: Jan. 5, 2021

(54) CASCODE AMPLIFIER OPTIMIZATION

(71) Applicant: SKYWORKS SOLUTIONS, INC., Woburn, MA (US)

(72) Inventors: Yun Shi, San Diego, CA (US); Paul T. Dicarlo, Marlborough, MA (US); Hailing Wang, Acton, MA (US)

(73) Assignee: SKYWORKS SOLUTIONS, INC., Irvine, CA (US)

( * ) Notice: Subject to any disclaimer, the term of this patent is extended or adjusted under 35 U.S.C. 154(b) by 63 days.

(21) Appl. No.: 15/894,037

(22) Filed: Feb. 12, 2018

(65) Prior Publication Data

US 2018/0233578 A1    Aug. 16, 2018

Related U.S. Application Data

(60) Provisional application No. 62/459,380, filed on Feb. 15, 2017.

(51) Int. Cl.

| | |
|---|---|
| *H01L 29/66* | (2006.01) |
| *H01L 29/78* | (2006.01) |
| *H01L 21/265* | (2006.01) |
| *H01L 29/10* | (2006.01) |
| *H01L 21/8234* | (2006.01) |
| *H01L 21/84* | (2006.01) |
| *H03F 1/22* | (2006.01) |
| *H01L 29/423* | (2006.01) |
| *H03F 3/195* | (2006.01) |
| *H03F 3/24* | (2006.01) |
| *H03F 3/04* | (2006.01) |
| *H01L 27/12* | (2006.01) |

(52) U.S. Cl.
CPC .. *H01L 29/66492* (2013.01); *H01L 21/26513* (2013.01); *H01L 21/823412* (2013.01); *H01L 21/823418* (2013.01); *H01L 21/823462* (2013.01); *H01L 21/823493* (2013.01); *H01L 21/84* (2013.01); *H01L 29/1041* (2013.01); *H01L 29/42368* (2013.01); *H01L 29/66659* (2013.01); *H01L 29/66772* (2013.01); *H01L 29/7833* (2013.01); *H01L 29/7835* (2013.01); *H03F 1/223* (2013.01); *H03F 3/195* (2013.01); *H03F 3/245* (2013.01); *H01L 21/26586* (2013.01); *H01L 27/1203* (2013.01); *H01L 29/1045* (2013.01); *H03F 3/04* (2013.01); *H03F 2200/451* (2013.01)

(58) Field of Classification Search
None
See application file for complete search history.

(56) References Cited

U.S. PATENT DOCUMENTS

| | | | | |
|---|---|---|---|---|
| 5,716,866 | A * | 2/1998 | Dow | H01L 21/823412 257/E21.427 |
| 6,121,666 | A * | 9/2000 | Burr | H01L 29/7835 257/344 |
| 8,753,941 | B1 * | 6/2014 | Benaissa | H01L 21/823814 257/358 |
| 2010/0001342 | A1 * | 1/2010 | Furuhata | H01L 29/7816 257/338 |

(Continued)

*Primary Examiner* — Nilufa Rahim
(74) *Attorney, Agent, or Firm* — Lando & Anastasi, LLP

(57) ABSTRACT

A cascode amplifier including a common-source device and a common-gate device formed utilizing different processing parameters to separately optimize performance of the common-source device and common-gate device.

12 Claims, 19 Drawing Sheets

(56) References Cited

U.S. PATENT DOCUMENTS

| | | | |
|---|---|---|---|
| 2012/0175679 A1* | 7/2012 | Marino | H01L 29/407 257/194 |
| 2015/0035072 A1* | 2/2015 | Dutta | H01L 21/823468 257/369 |
| 2015/0061776 A1* | 3/2015 | Ali | H03F 3/195 330/296 |
| 2016/0126906 A1* | 5/2016 | Maxim | H03F 1/26 330/296 |

* cited by examiner

CASCODE AMPLIFIER OPTIMIZATION

CROSS REFERENCE TO RELATED APPLICATIONS

This application claims priority under 35 U.S.C. § 119(e) to U.S. Provisional Patent Application Ser. No. 62/459,380, titled "CASCODE AMPLIFIER OPTIMIZATION," filed Feb. 15, 2017, which is incorporated by reference herein in its entirety for all purposes.

BACKGROUND

Field of Invention

The present invention relates generally to methods for fabricating cascode amplifiers and to cascode amplifiers formed by such methods.

Discussion of Related Art

A cascode amplifier is a two-stage amplifier including a common emitter stage feeding into a common base stage for bipolar technologies, or a common source stage feeding into a common gate stage for field effect transistor (FET) technologies. Compared to a single stage amplifier, a cascode amplifier may exhibit higher input-output isolation, higher input impedance, high output impedance, higher gain, and higher bandwidth. A cascode is often constructed from two transistors with one operating as common source and the other as a common gate. The cascode improves input-output isolation and bandwidth as there is no direct coupling from the output to input. An example of a cascode amplifier circuit that may be used in RF circuits is illustrated in FIG. 1, generally at 100, where the common gate transistor is indicated at 105 and the common source transistor is indicated at 110.

SUMMARY OF INVENTION

According to one aspect there is provided a method of fabricating a cascode amplifier including a common-source device and a common-gate device. The method comprises performing one or more of ion implantation of a well of the common-source device, ion implantation of a source extension and/or drain extension of the common-source device, or a halo ion implantation of the common-source device with one or more of a different ionic species, a different dosage, a different energy, or a different tilt angle than a corresponding one or more of ion implantation of a well of the common-gate device, ion implantation of a source and/or drain extension of the common-gate device, or a halo ion implantation of the common-gate device.

In some embodiments, the method further comprises doping one of the common-source device and common-gate device with a dopant that changes a growth rate of a gate oxide of the one of the common-source device and common-gate device relative to the other of the common-source device and common-gate device.

In some embodiments, the method further comprises fabricating one of the common-source device and common-gate device with a gate oxide thickness that is thicker than the gate oxide thickness of the other of the common-source device and common-gate device.

In some embodiments, doping the one of the common-source device and common-gate device with the dopant that changes the growth rate of the gate oxide includes doping the one of the common-source device and common-gate device with the dopant that reduces the growth rate of the gate oxide.

In some embodiments, doping the one of the common-source device and common-gate device with the dopant that changes the growth rate of the gate oxide includes doping the one of the common-source device and common-gate device with the dopant that increases the growth rate of the gate oxide.

In some embodiments, the method further comprises fabricating one of the common-source device and common-gate device with a gate oxide thickness proximate a drain of the one of the common-source device and common-gate device that is thicker than a gate oxide thickness proximate a source of the one of the common-source device and common-gate device.

In some embodiments, the method further comprises creating a doping profile on a source side of the well of one of the common-source device and common-gate device that is asymmetric with respect to a drain side of the well of the one of the common-source device and common-gate device.

In some embodiments, the method further comprises creating a doping profile of the well of the common-source device that is different than a doping profile of the well of the common-gate device.

In some embodiments, the method further comprises creating a doping profile of a source and/or drain of the common-source device is different than a doping profile of a source and/or drain of the common-gate device.

In some embodiments, the method further comprises forming a module for an electronic device including the cascode amplifier.

In accordance with another aspect, there is provided method of fabricating a cascode amplifier including a common-source device and a common-gate device. The method comprises fabricating one of the common-source device and common-gate device with one of a gate oxide thickness of the one of the common-source device and common-gate device that is thicker than the gate oxide thickness of the other of the common-source device and common-gate device, a gate oxide thickness proximate a drain of the one of the common-source device and common-gate device that is thicker than the gate oxide thickness proximate a source of the one of the common-source device and common-gate device, or a doping profile on a source side of a well of one of the common-source device and common-gate device that is asymmetric with respect to a drain side of the well of the one of the common-source device and common-gate device.

In some embodiments, the method further comprises forming a module for an electronic device including the cascode amplifier.

In accordance with another aspect, there is provided cascode amplifier including a common-source device and a common-gate device comprising doping profiles formed by performing one or more of ion implantation of a well of the common-source device, ion implantation of a source extension and/or drain extension of the common-source device, or a halo ion implantation of the common-source device with one or more of a different ionic species, a different dosage, a different energy, or a different tilt angle than a corresponding one or more of ion implantation of a well of the common-gate device, ion implantation of a source extension and/or drain extension of the common-gate device, or a halo ion implantation of the common-gate device.

In some embodiments, one of the common-source device and common-gate device has a gate oxide with a different thickness than a gate oxide of the other of the one of the common-source device and common-gate device.

In some embodiments, one of the common-source device and common-gate device has a gate oxide thickness proximate a drain of the one of the common-source device and common-gate device that is thicker than the gate oxide thickness proximate a source of the one of the common-source device and common-gate device.

In some embodiments, the cascode amplifier has a doping profile on a source side of a well of one of the common-source device and common-gate device that is asymmetric with respect to a drain side of the well of the one of the common-source device and common-gate device.

In some embodiments, a doping profile of one of a source, a drain, or the well of the common-source device is different than a doping profile a corresponding one of a source, a drain, or well of the common-gate device.

In accordance with another aspect, there is provided a module for an electronic device including a cascode amplifier as described above. The module may be included in an electronic device. The module may be included in a radio frequency device.

BRIEF DESCRIPTION OF DRAWINGS

Various aspects of at least one embodiment are discussed below with reference to the accompanying drawings. In the drawings, which are not intended to be drawn to scale, each identical or nearly identical component that is illustrated in various drawings is represented by a like numeral. For purposes of clarity, not every component may be labeled in every drawing. The drawings are provided for the purposes of illustration and explanation, and are not intended as a definition of the limits of the invention. In the drawings.

DETAILED DESCRIPTION

Various aspects and embodiments disclosed herein relate to an improved method of fabricating cascode amplifiers and to improved cascode amplifiers fabricated by these improved methods. Various aspects and embodiments disclosed herein relate to structures and methods for designing and optimizing the manufacturing process and semiconductor device for the common-source gain-stage and the common-gate cascode-stage in an integrated silicon (Si) technology, including but not limited to complementary metal-oxide-semiconductor (CMOS), silicon-on-insulator (SOI), high-voltage CMOS and laterally diffused metal oxide semiconductor (LDMOS), silicon-germanium heterojunction bipolar transistor (SiGe HBT) or any III-V device technology, gallium nitride (GaN)-on-silicon, GaN on GaN, GaN on silicon carbide (SiC), etc. to improve parameters of the cascode amplifier circuit performance including gain, linearity, noise, efficiency, input-output isolation, and reliability.

In prior processes for fabricating cascode amplifiers, both the common-source and common-gate transistors were formed concurrently in a same set of processing steps. This resulted in the common-source and common-gate transistors having similar parameters, for example, doping levels and doping profiles and gate oxide thicknesses. It has been discovered that the performance of cascode amplifiers may be improved by separately optimizing the manufacturing processes for the common-source and common-gate transistors to optimize the performance of these different transistors for their different functions. Parameters that may be vary between the common-source and common-gate transistors to optimize the respective performance of these devices include, for example, well ion implantation, source or drain extension ion implantation, halo ion implantation, gate oxide thickness, and gate oxide shape. In the discussion that follows, partially formed common-source devices and common-gate devices may be referred to as common-source devices and common-gate devices for simplicity.

Figure 1:
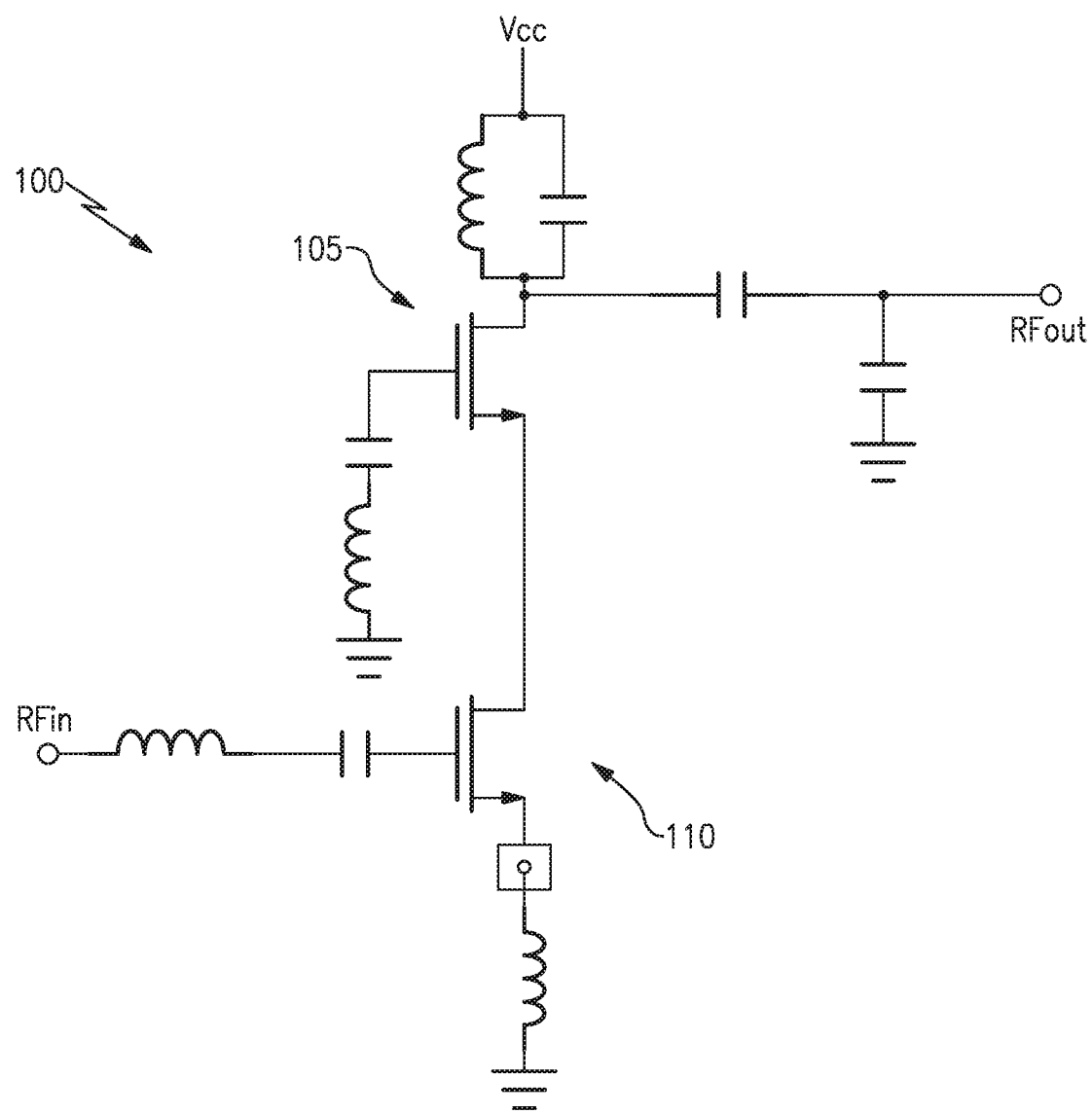
FIG. 1 illustrates an example of a cascode amplifier circuit.
Figure 2A:
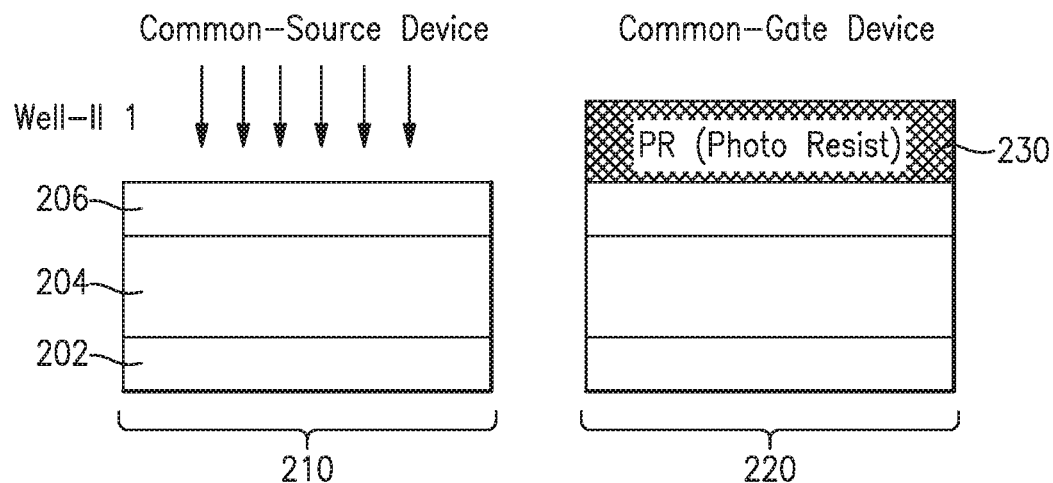
FIG. 2A illustrates an act performed during fabrication of a cascode amplifier circuit.
Figure 2B:
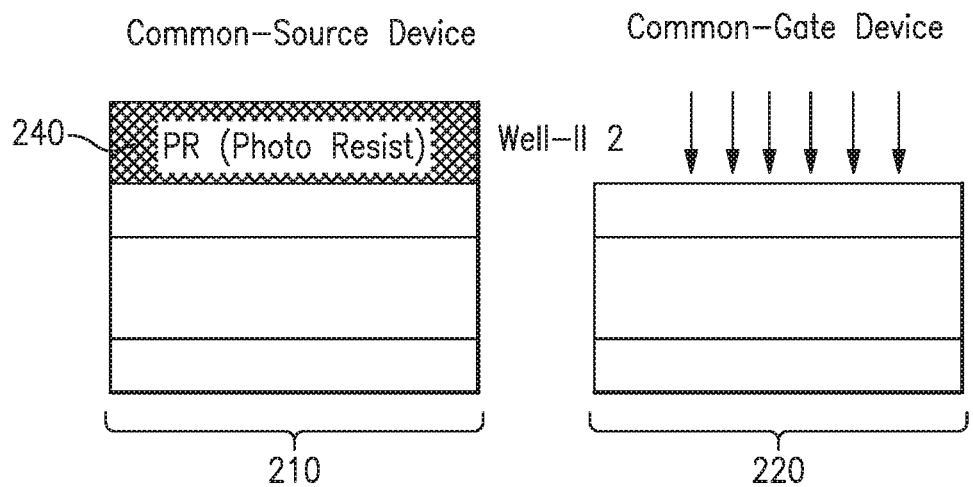
FIG. 2B illustrates another act performed during fabrication of a cascode amplifier circuit.

In a first embodiment, dedicated well, source extension, drain extension, and/or halo implant masks may be utilized to optimize the common-source and common-gate transistors (also referred to herein as common-source and common-gate devices) independently to achieve the improved gain, noise, linearity, isolation, and/or cutoff frequency to maximum frequency ratio ($f_T/f_{max}$) ratio for the cascode core. An example of this is illustrated in FIGS. 2A-2D. FIGS. 2A-2D illustrate separate sections of a silicon-on-insulator substrate (including base substrate 202, buried oxide layer 204, and device layer 206) in which a common-source device 210 and a common-gate device 220, respectively are to be formed. In FIG. 2A, the portion of the substrate in which the common-gate device (or at least the well or channel region of the common-gate device) is covered by a layer of photoresist 230. A first well ion implant (Well-II 1) is performed with a first ionic species (for example, indium or boron) at a first energy, a first dosage, and at a first angle relative to the plane of the semiconductor substrate (a first tilt angle). The first well ion implant deposits the first ionic species into the well of the common-source device to form a first implanted ionic species distribution. The ionic species is blocked from being implanted into the well of the common-gate device by the layer of photoresist 230.

After the Well-II 1 implant has been performed the photoresist is removed from the portion of the substrate in which the common-gate device is to be formed and a second layer of photoresist 240 is deposited on the portion of the substrate in which the common-source device (or at least the well or channel region of the common-source device) is to be formed. (See FIG. 2B.) A second ion implantation step (Well-II 2) is then performed to implant ionic species into the portion of the substrate in which the common-gate device is to be formed. The photoresist 240 blocks ionic species from the Well-II 2 ion implant from being implanted into the portion of the substrate in which the common-source device is to be formed. The Well-II 2 implant may be performed with any one or more of a different ionic species, a different energy, a different dosage, or a different tilt angle than the Well-II 1 implant so that a second implanted ionic species distribution different from the first implanted ionic species distribution is formed in the portion of the substrate in which the common-gate device is to be formed.

Figure 2C:
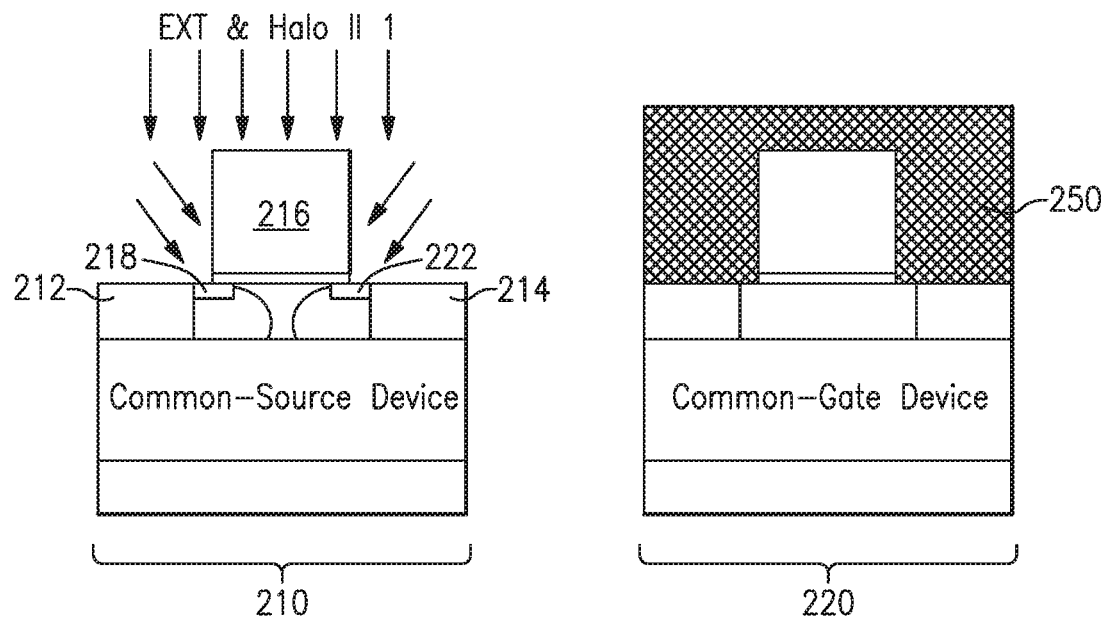
FIG. 2C illustrates another act performed during fabrication of a cascode amplifier circuit.

FIG. 2C illustrates that after formation of the source 212, drain 214, gate 216, and possibly the source and drain extensions 218, 222 are formed for the common-source and common-gate devices, the common-gate device is covered with a layer of photoresist 250 and extension and halo region ion implants (Ext & Halo II 1) are performed for the common-source device. The ionic species deposited into the common-source device in the Ext & Halo II 1 ion implant are blocked from the common-gate device by the layer of photoresist 250.

Figure 2D:
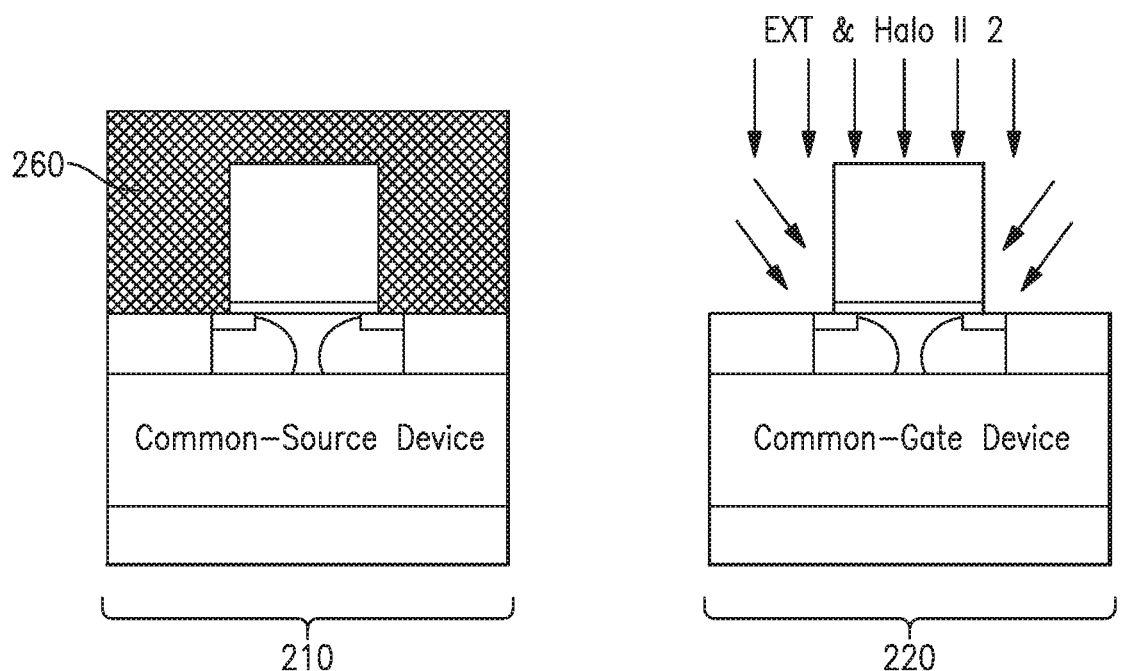
FIG. 2D illustrates another act performed during fabrication of a cascode amplifier circuit.
Figure 3:
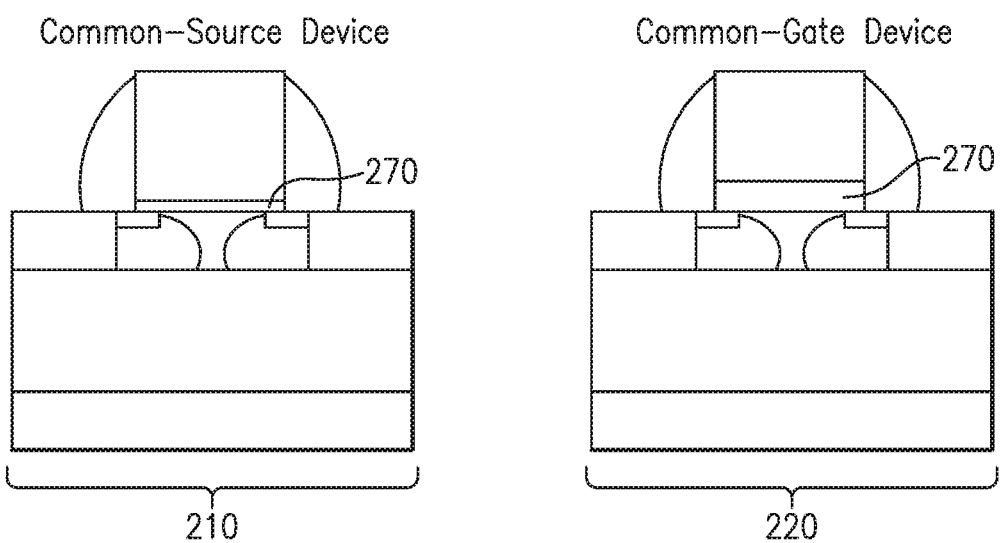
FIG. 3 illustrates a common-source device and a common-gate device of a cascode amplifier circuit having different gate oxide thicknesses.
Figure 4A:
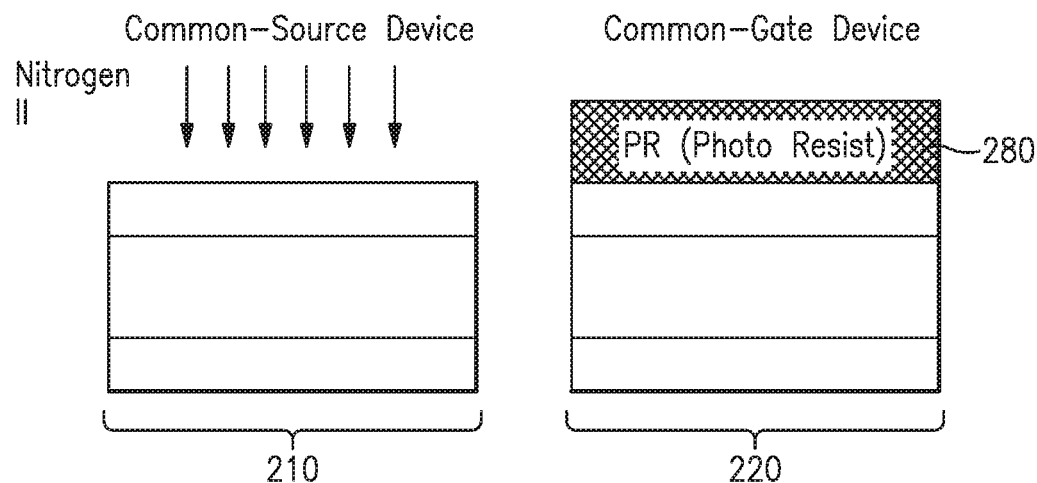
FIG. 4A illustrates an act performed during fabrication of a cascode amplifier circuit.
Figure 4B:
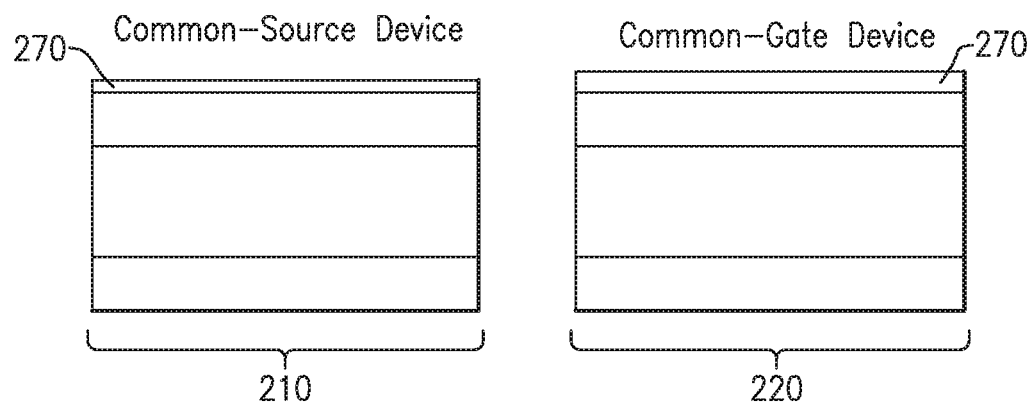
FIG. 4B illustrates another act performed during fabrication of a cascode amplifier circuit.

After the Ext & Halo II 1 ion implant is performed the layer of photoresist 250 is removed and another layer of photoresist 260 is deposited over the common-source device as illustrated in FIG. 2D. Extension and halo region ion implants (Ext & Halo II 2) are performed for the common-gate device. The ionic species deposited into the common-gate device in the Ext & Halo II 2 ion implant are blocked from the common-source device by the layer of photoresist 260. The Ext & Halo II 2 implant may be performed with any one or more of a different ionic species, a different energy, a different dosage, or a different tilt angle than the Ext & Halo II 1 implant so that the extension and/or halo regions of the common-source and common-gate devices are provided with different implanted ionic species distributions In another embodiment, the gate oxide growth rate is made different between the common-source device and the common-gate device. In this embodiment a dedicated implant is performed before a single gate oxide growth step to enhance or reduce the gate oxidation rate of the common-source device relative to the common-gate device. Different gate oxide thicknesses for the common-source device and the common-gate device may be separately optimized to achieve the improved gain, noise, linearity, input-output isolation, and/or $f_T/f_{max}$ ratio for the cascode core. For example, silicon doped with antimony or arsenic may exhibit a higher growth rate of silicon oxide than undoped silicon. Silicon doped with nitrogen may exhibit a slower growth rate of silicon oxide than undoped silicon. Accordingly, the areas on which gate oxide is to be grown on one of the common-source devices or the common-gate devices may be subjected to ion implantation with antimony or arsenic and/or the areas on which gate oxide is to be grown on the other one of the common-source devices or the common-gate devices may be subjected to ion implantation with nitrogen. The gate oxides of the common-source devices and the common-gate devices may then be grown concurrently in a single gate oxide growth operation. The one of the common-source devices or the common-gate devices that were subjected to the gate oxide growth modifying antimony or arsenic ion implant will grow a thicker gate oxide than the other of the common-source devices or the common-gate devices that were either not subjected to the gate oxide growth modifying antimony or arsenic ion implant or that were subjected to a gate oxide growth modifying nitrogen ion implant. The one of the common-source devices or the common-gate devices that were subjected to the gate oxide growth modifying nitrogen ion implant will grow a thinner gate oxide than the other of the common-source devices or the common-gate devices that were either not subjected to the gate oxide growth modifying nitrogen ion implant or that were subjected to a gate oxide growth modifying antimony or arsenic ion implant. FIG. 3 illustrates a comparison between gate oxide 270 thicknesses (not to scale) between a common-source device that was subjected to a gate oxide growth modifying nitrogen ion implant and a common-gate device that was subjected to a gate oxide growth modifying antimony or arsenic ion implant prior to gate oxide growth. The gate oxide growth modifying ion implant may be a low energy, high dose implant that implants the desired ionic species to a depth of about a nanometer or less into the areas of the devices on which gate oxide is to be grown.

Alternative methods of performing the gate oxide growth modifying ion implants are illustrated in FIGS. 4A-5B. These methods illustrate a thicker gate oxide 270 being grown for the common-gate device 220, but such methods may equally be applicable to growing a thicker gate oxide 270 for the common-source device 210. In the act illustrated in FIG. 4A, nitrogen ions are ion implanted into an area of a common-source device 210 where a gate oxide is to be grown. The nitrogen implant is blocked by a layer of photoresist 280 covering the area of a common-gate device 220 where a gate oxide is to be grown. After the nitrogen implant, the photoresist 280 is removed and the gate oxides for the common-source device 210 and common-gate device 220 are concurrently grown, for example, in a diffusion furnace. The rate of growth of the gate oxide for the common-source device 210 is retarded relative to the rate of growth of the gate oxide for the common-gate device 220 due to the presence of the nitrogen on the surface of the area of the common-source device 210 where the gate oxide is grown. The resultant gate oxide 270 for the common-source device 210 is thinner than the gate oxide 270 for the common-gate device 220 as illustrated in FIG. 4B.

Figure 5A:
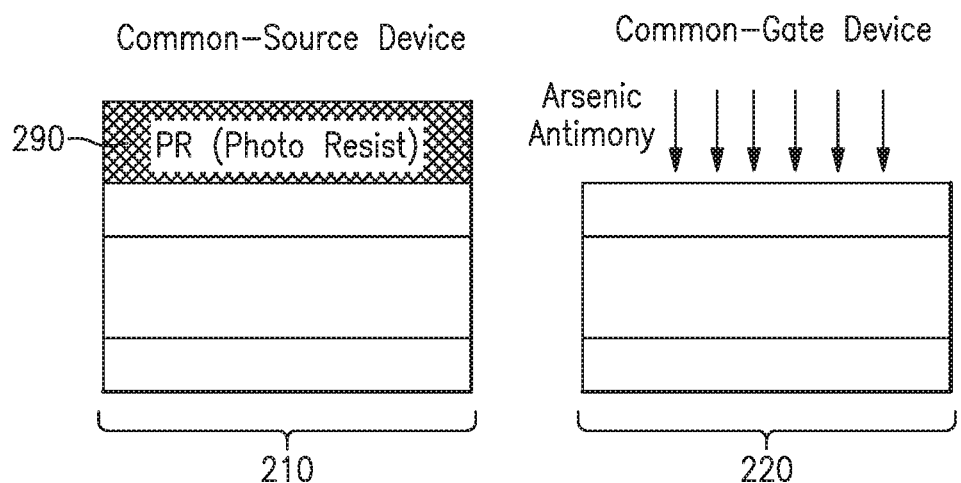
FIG. 5A illustrates another act performed during fabrication of a cascode amplifier circuit.
Figure 5B:
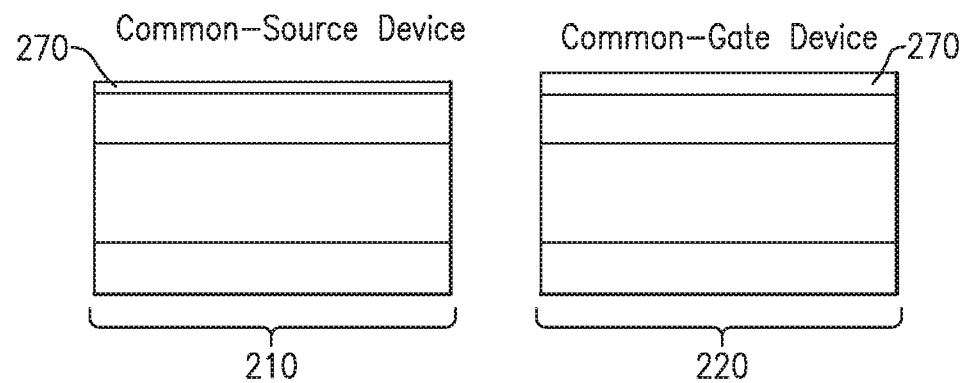
FIG. 5B illustrates another act performed during fabrication of a cascode amplifier circuit.

In the act illustrated in FIG. 5A, arsenic and/or antimony ions are ion implanted into an area of a common-gate device 220 where a gate oxide is to be grown. The arsenic and/or antimony implant is blocked by a layer of photoresist 290 covering the area of a common-source device 210 where a gate oxide is to be grown. After the arsenic and/or antimony implant, the photoresist 290 is removed and the gate oxides for the common-source device 210 and common-gate device 220 are concurrently grown, for example, in a diffusion furnace. The rate of growth of the gate oxide for the common-gate device 220 is accelerated relative to the rate of growth of the gate oxide for the common-source device 210 due to the presence of the arsenic and/or antimony on the surface of the area of the common-gate device 220 where the gate oxide is grown. The resultant gate oxide 270 for the common-gate device 220 is thicker than the resultant gate oxide 270 for the common-source device 210 as illustrated in FIG. 5B.

Figure 6A:
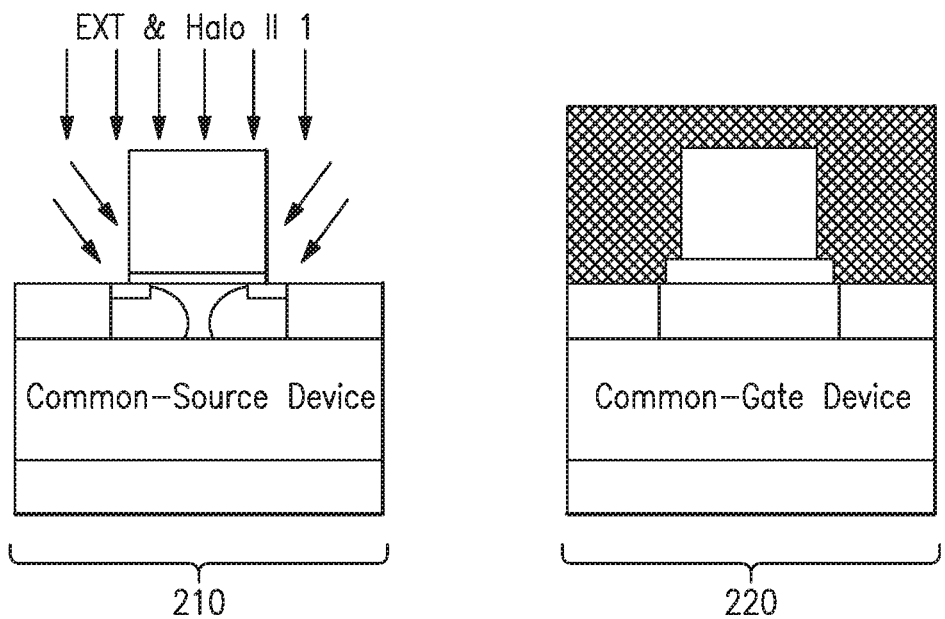
FIG. 6A illustrates another act performed during fabrication of a cascode amplifier circuit.
Figure 6B:
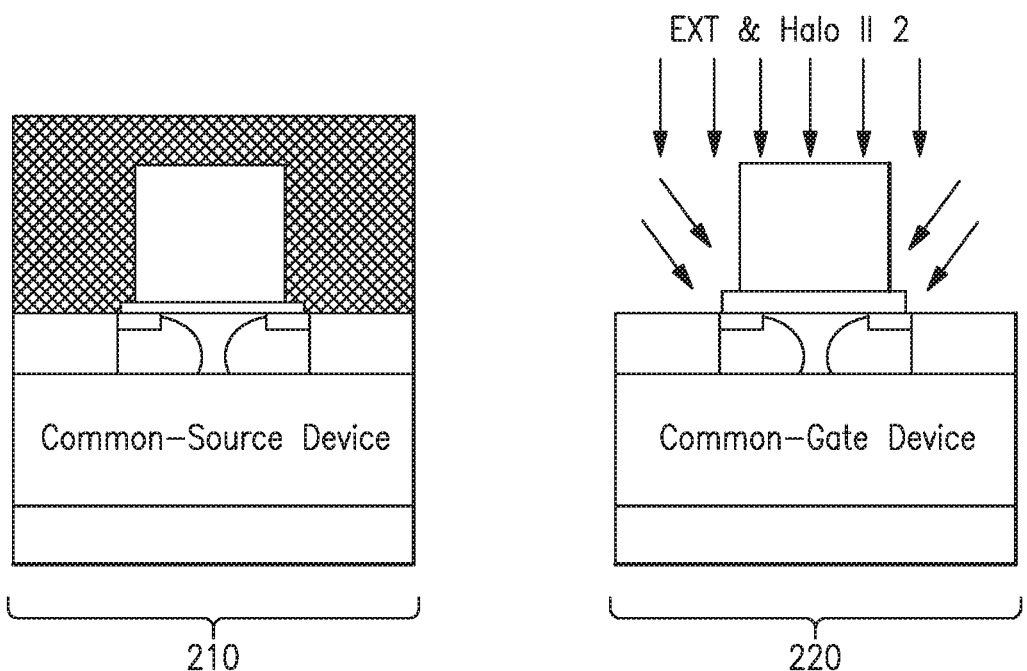
FIG. 6B illustrates another act performed during fabrication of a cascode amplifier circuit.

As illustrated in FIGS. 6A and 6B, the method of performing ion implants using different ionic species or implantation parameters for common-gate devices vs. common-source devices described with reference to FIGS. 2A-2D may be combined with methods of altering the gate oxide grown rate for common-gate devices vs. common-source devices described with reference to FIGS. 4A-5B. The common-gate devices and common-source devices may have different gate oxide thicknesses as well as different source/drain extension and/or halo implant profiles.

In another embodiment, the gate oxide of the common-gate devices and/or common-source devices may be tapered or stepped. The gate oxide may be thinner over the channel regions of the devices proximate the source regions and thicker proximate the drain regions. This variation in gate oxide thickness across the devices may improve cascode circuit performance by making the devices more robust. The variation in gate oxide thickness across the devices may be accomplished using one or more of wet-etching to create the tapered gate oxide profile over the drain side of the devices, arsenic or antimony doping over the drain side of the devices to enhance the growth rate of the gate oxide proximate the drains of the devices, or by performing a selective over-etch at the drain side to create a "bird's beak" and tapered oxide profile over the drain side of the devices.

Figure 7A:
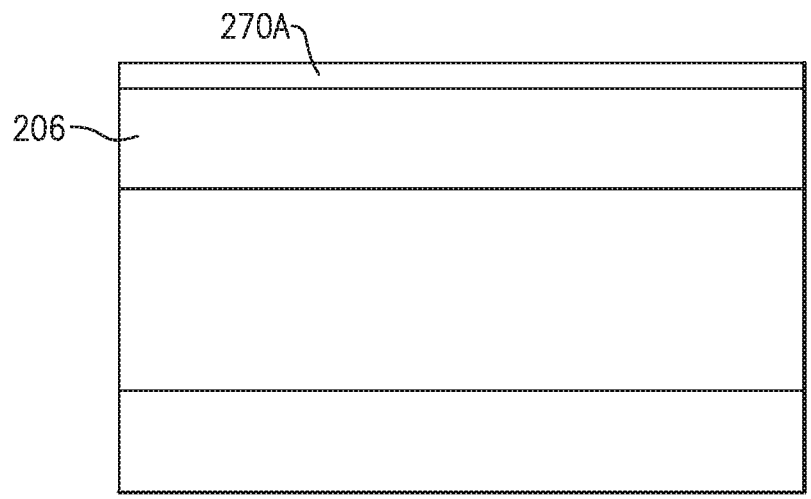
FIG. 7A illustrates an act performed during fabrication of a cascode amplifier circuit.
Figure 7B:
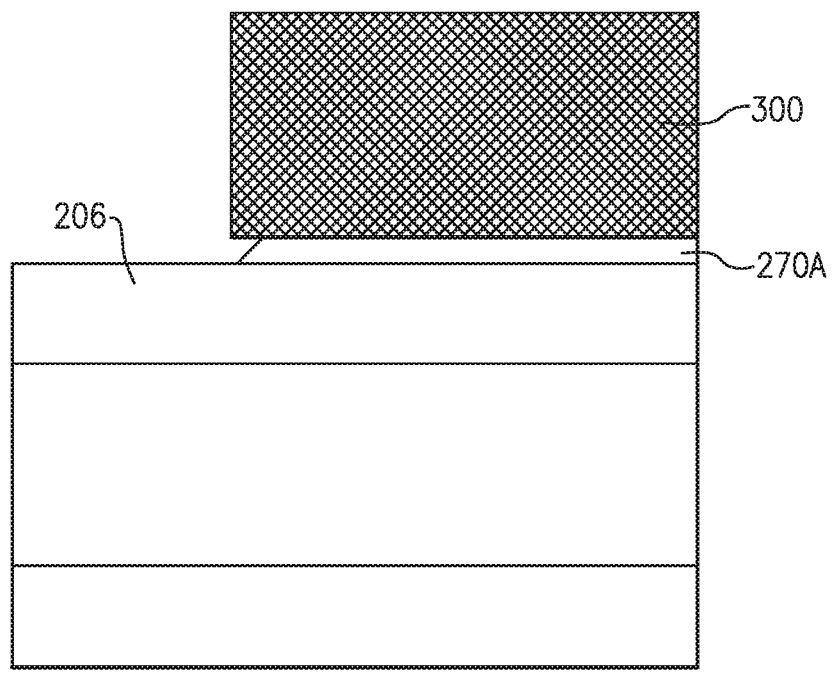
FIG. 7B illustrates another act performed during fabrication of a cascode amplifier circuit.
Figure 7C:
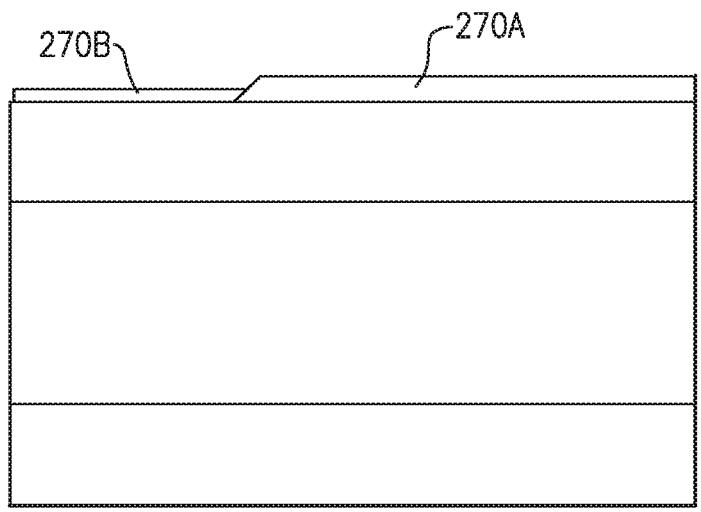
FIG. 7C illustrates another act performed during fabrication of a cascode amplifier circuit.
Figure 7D:
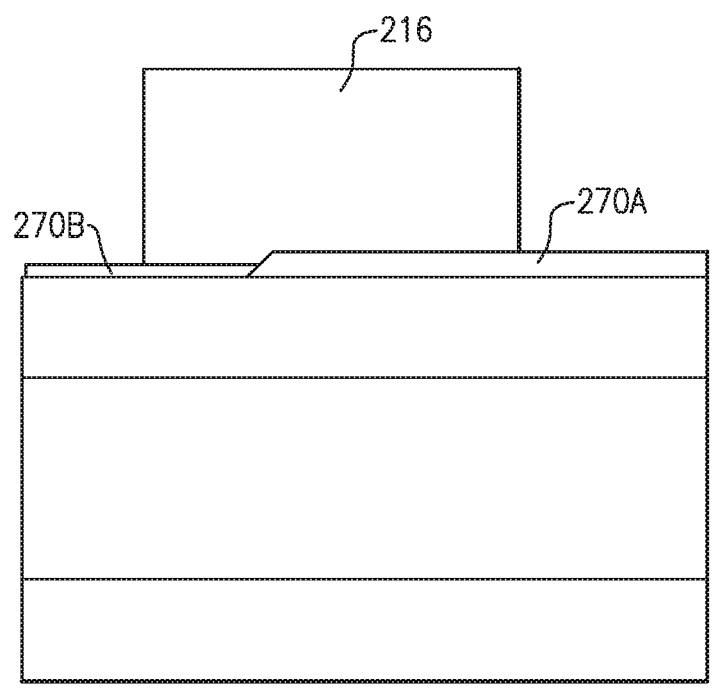
FIG. 7D illustrates another act performed during fabrication of a cascode amplifier circuit.
Figure 7E:
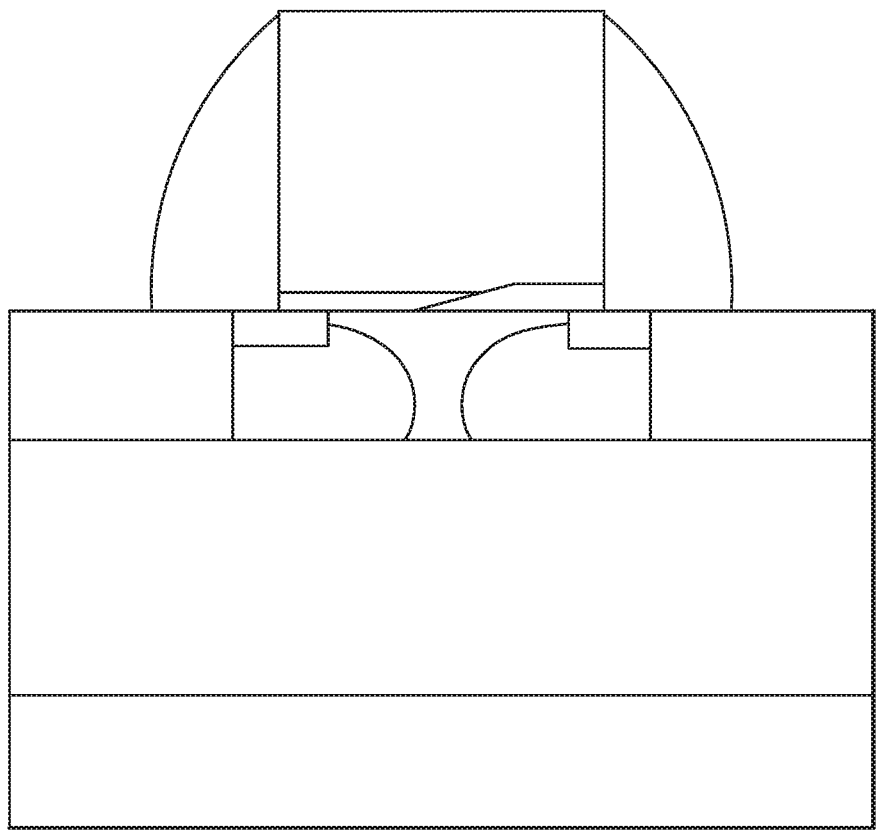
FIG. 7E illustrates a device of a cascode amplifier circuit including a gate oxide thicker on the drain side than on the source side.

A method of using wet etching to create a tapered gate oxide is illustrated in FIGS. 7A-7E. Features such as the well, source, and drain are omitted from FIGS. 7A-7D for simplicity of illustration. In the act illustrated in FIG. 7A, a thick gate oxide 270A is grown on the surface of the semiconductor material 206 using know methods, for example, thermal oxidation in a diffusion furnace. In the act illustrated in FIG. 7B a layer of photoresist 300 is deposited over a region in which a thicker gate oxide is desired and the gate oxide 270A in regions uncovered by the photoresist is etched away, for example, with a hydrofluoric acid wet etch. The photoresist 300 is then removed and the device is subjected to an additional oxidation step to grow a thinner gate oxide 270B on the portion of the semiconductor material 206 where the thicker gate oxide 270A was etched away (FIG. 7C). As illustrated in FIG. 7D, gate material 216, for example, polysilicon, is then deposited over the regions of thicker gate oxide 270A and thinner gate oxide 270B. The gate oxide 270A, 270B that is not covered by the gate material 216 is then etched away, and the device is completed as illustrated in FIG. 7E.

Figure 8A:
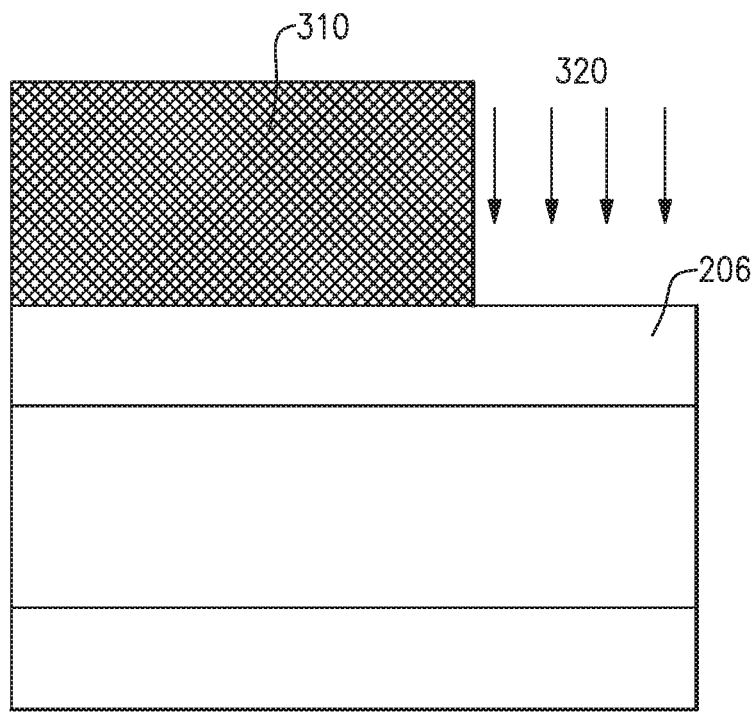
FIG. 8A illustrates an act performed during fabrication of a cascode amplifier circuit.
Figure 8B:
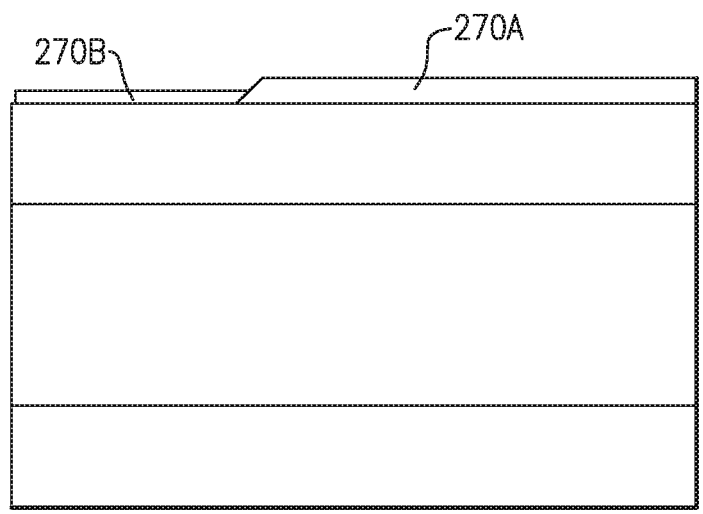
FIG. 8B illustrates another act performed during fabrication of a cascode amplifier circuit.
Figure 8C:
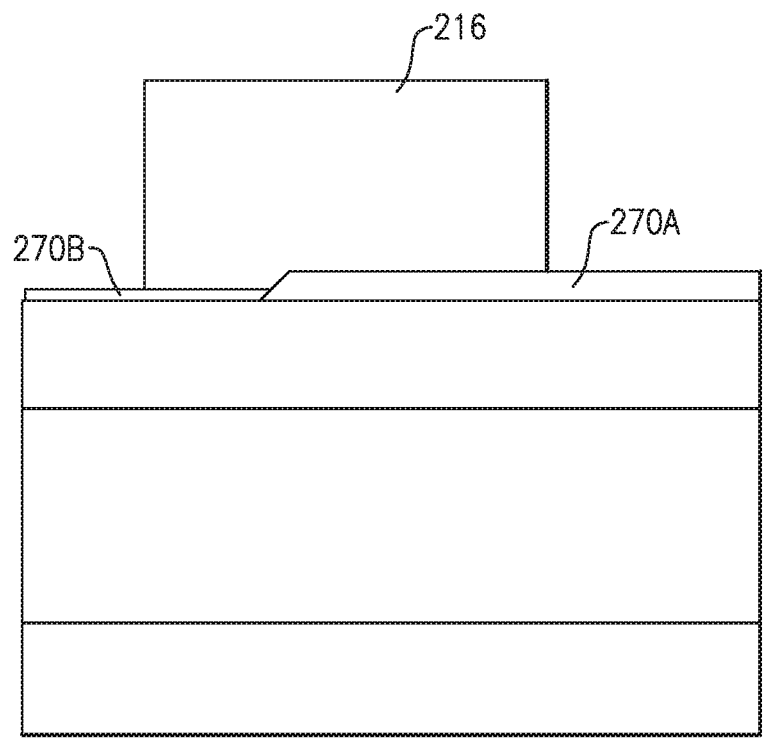
FIG. 8C illustrates another act performed during fabrication of a cascode amplifier circuit.
Figure 8D:
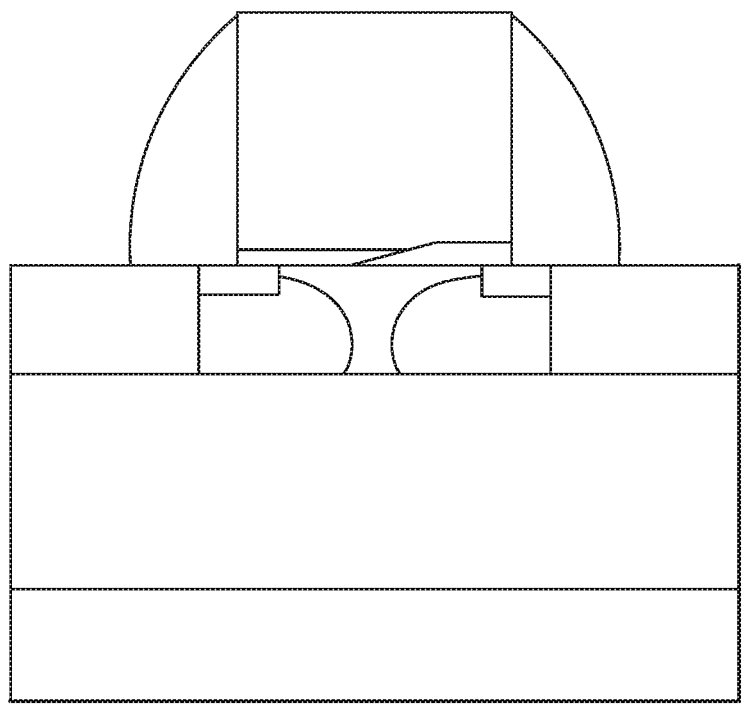
FIG. 8D illustrates a device of a cascode amplifier circuit including a gate oxide thicker on the drain side than on the source side.

A method of using arsenic or antimony doping over the drain side of the devices to enhance the growth rate of the gate oxide proximate the drains of the devices is illustrated in FIGS. 8A-8D. Features such as the well, source, and drain are omitted from FIGS. 8A-8C for simplicity of illustration. FIG. 8A illustrates photoresist 310 deposited over an area on the surface of the semiconductor material 206 of the device where a thinner gate oxide is to be grown. A high concentration, low depth ion implantation of arsenic or antimony 320 is performed into the surface of the semiconductor material 206. The photoresist 310 blocks the arsenic or antimony implant into the area on the surface of the semiconductor material 206 of the device where a thinner gate oxide is to be grown. The photoresist 310 is removed and the gate oxide is grown on the surface of the semiconductor material 206 using know methods, for example, thermal oxidation in a diffusion furnace. A thicker gate oxide 270A grows on the area that was implanted with the arsenic or antimony and a thinner gate oxide 270B grown on the area that was not implanted as illustrated in FIG. 8B. As illustrated in FIG. 8C, gate material 216, for example, polysilicon, is then deposited over the regions of thicker gate oxide 270A and thinner gate oxide 270B. The gate oxide 270A, 270B that is not covered by the gate material 216 is then etched away, and the device is completed as illustrated in FIG. 8D. In an alternative to this method, a material that retards the growth rate of the gate oxide, for example, nitrogen may be deposited on areas in which a thinner gate oxide is desired.

Figure 9A:
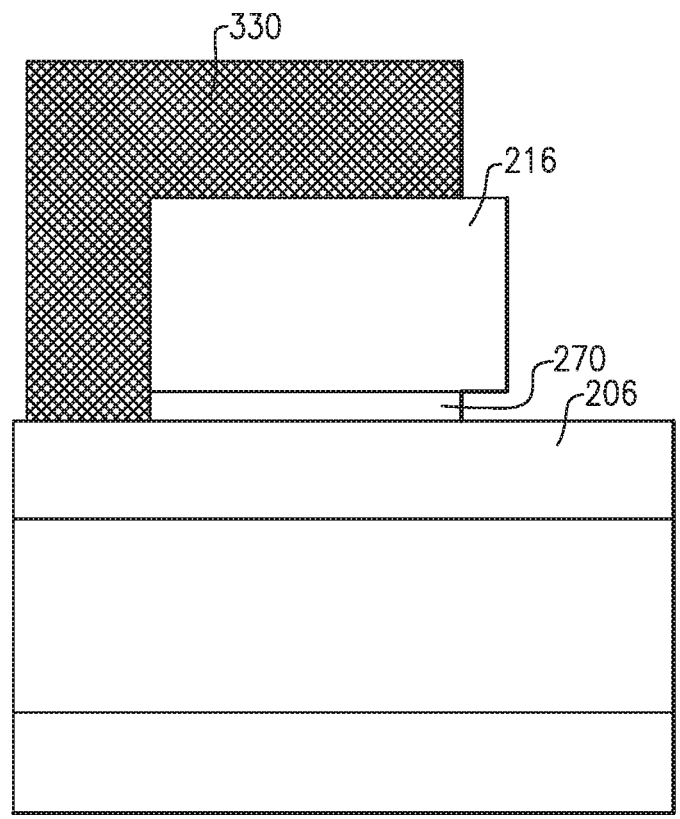
FIG. 9A illustrates an act performed during fabrication of a cascode amplifier circuit.
Figure 9B:
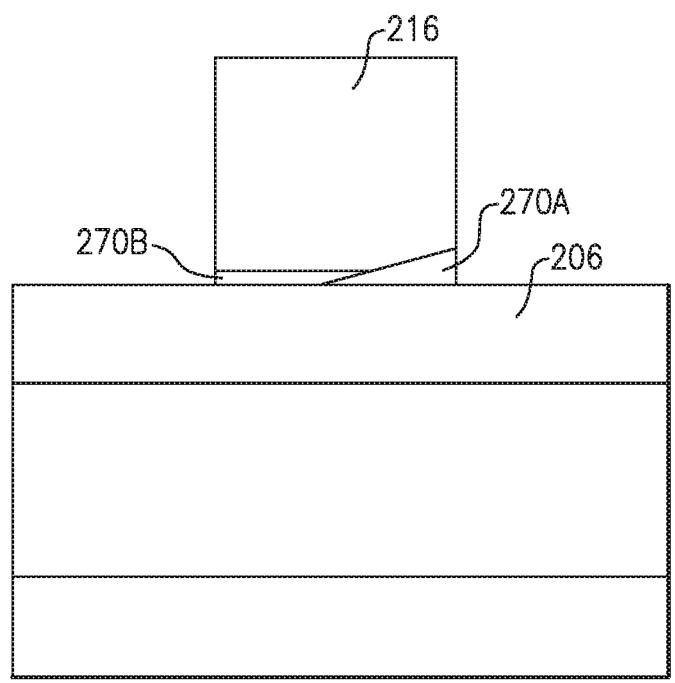
FIG. 9B illustrates another act performed during fabrication of a cascode amplifier circuit.
Figure 9C:
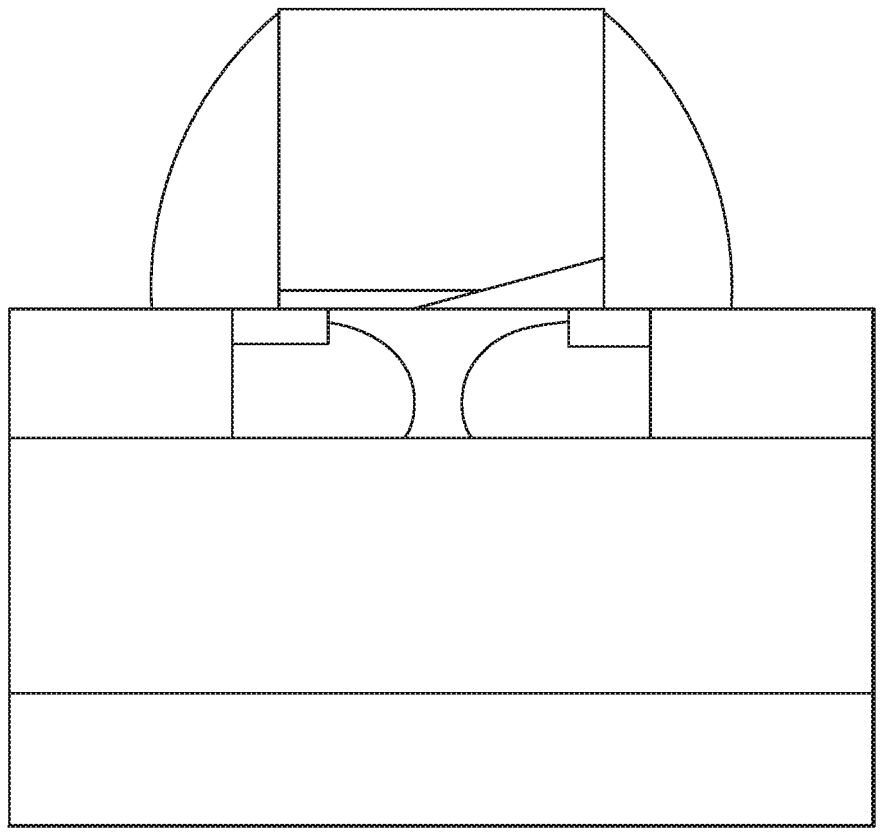
FIG. 9C illustrates a device of a cascode amplifier circuit including a gate oxide thicker on the drain side than on the source side.

A method of performing a selective over-etch at the drain side to create a "bird's beak" and tapered oxide profile over the drain side of the devices is illustrated in FIGS. 9A-9C. Features such as the well, source, and drain are omitted from FIGS. 9A and 9B for simplicity of illustration. FIG. 9A illustrates that after a gate oxide 270 and gate 216 are formed using known processes, photoresist 330 may be deposited over a portion of the gate 216, exposing one side of the gate and underlying gate oxide 270. A wet etch may be utilized to remove a portion of the gate oxide 270, undercutting the gate 216. FIG. 9B illustrates that the photoresist 330 may be removed and a thermal oxidation step may be performed on the undercut gate which will result in a "bird's beak" of oxide being grown under the undercut portion of the gate, resulting in a thick gate oxide region 270A that is thicker than the gate oxide 270B under the remaining portion of the gate 216. Oxide on the semiconductor material 206 not under the gate 216 is removed and the device is completed as illustrated in FIG. 9C.

Figure 10A:
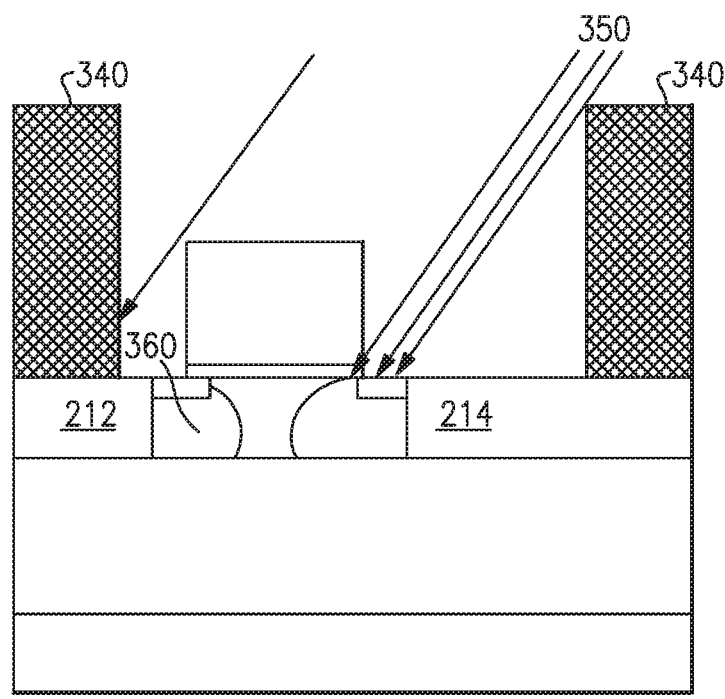
FIG. 10A illustrates an act performed during fabrication of a cascode amplifier circuit.
Figure 10B:
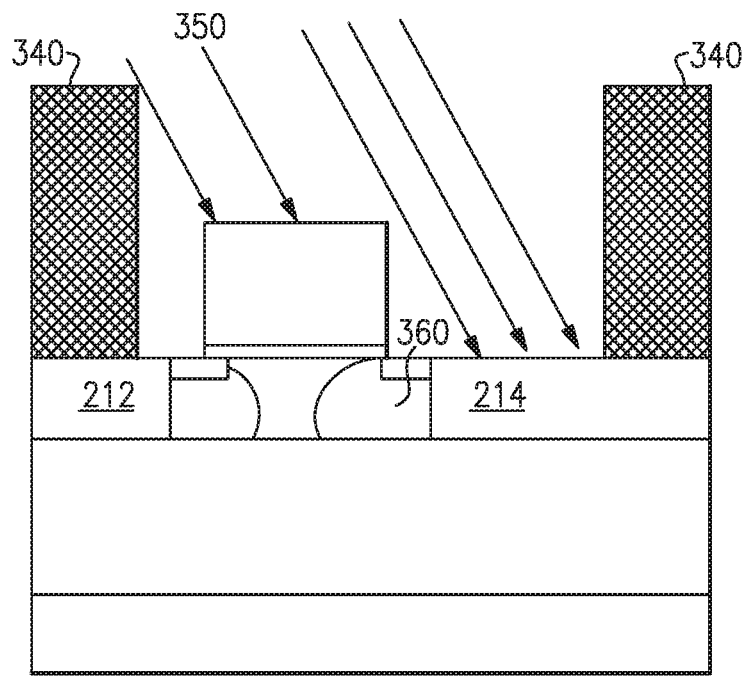
FIG. 10B illustrates another act performed during fabrication of a cascode amplifier circuit.
Figure 10C:
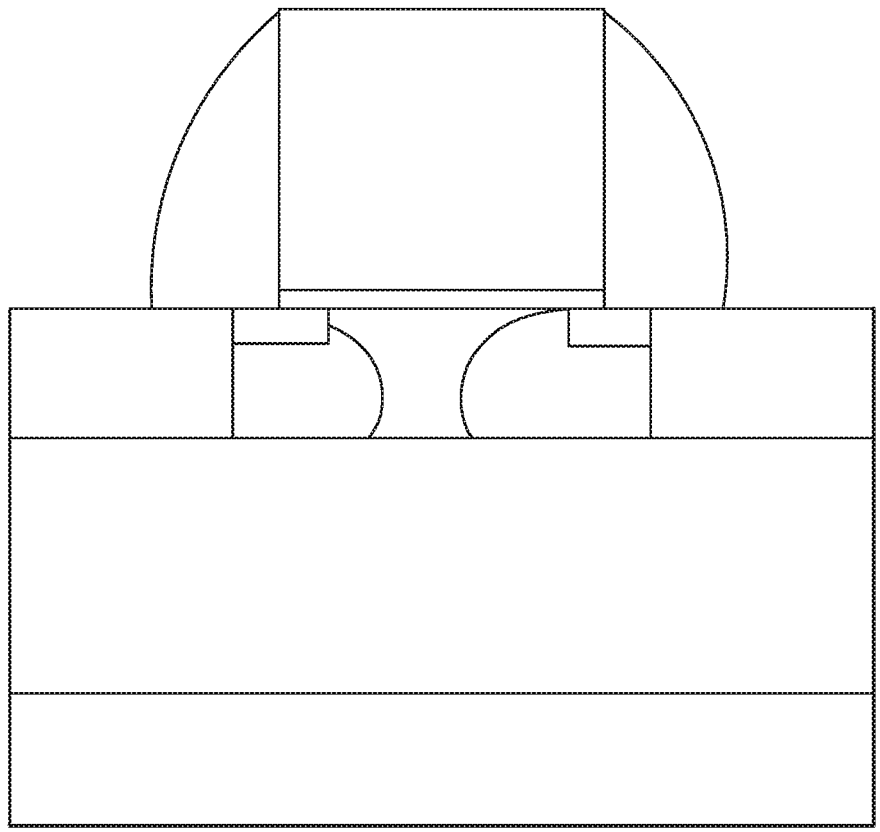
FIG. 10C illustrates a device of a cascode amplifier circuit including an asymmetric doping profile in the drain side of the well as compared to the source side of the well.

In accordance with another embodiment, an asymmetric source/drain extension and/or halo implant profile between the source and drain sides is created in the common-gate and/or common-source devices of a cascode. The asymmetric source/drain extension and/or halo implant profile may reduce a drain-induced barrier lowering effect in the devices, may reduce the gate-drain capacitance of the devices, and may improve self-gain of the devices. The asymmetric source/drain extension and/or halo implant profile may be created using photo shadowing in an ion implantation step to at least partially block ion implantation into the source or drain sides of the device. As illustrated in FIG. 10A, photoresist 340 is deposited spaced from the device with different spacings from the source 212 side of the device and the drain 214 side of the device. Ion implantation is then performed at a large tilt angle, for example, at a tilt angle of 45° or more. As illustrated in FIG. 10A the photoresist 340 is spaced sufficiently far from the drain 214 side of the device that ionic species 350 reach and are deposited in the drain 214 side of the well 360 of the device. As illustrated in FIG. 10B the photoresist 340 is spaced sufficiently close to the source 212 side of the device that ionic species 350 are blocked by the photoresist 340 from reaching the source 212 side of the well 360. Consequently, the drain 214 side of the well 360 of the device receives a larger dosage of implanted ions than the source 212 side of the well 360 of the device. The completed device is illustrated in FIG. 10C. The asymmetric source/drain side doping helps reduce short channel effects in the device.

Figure 11:
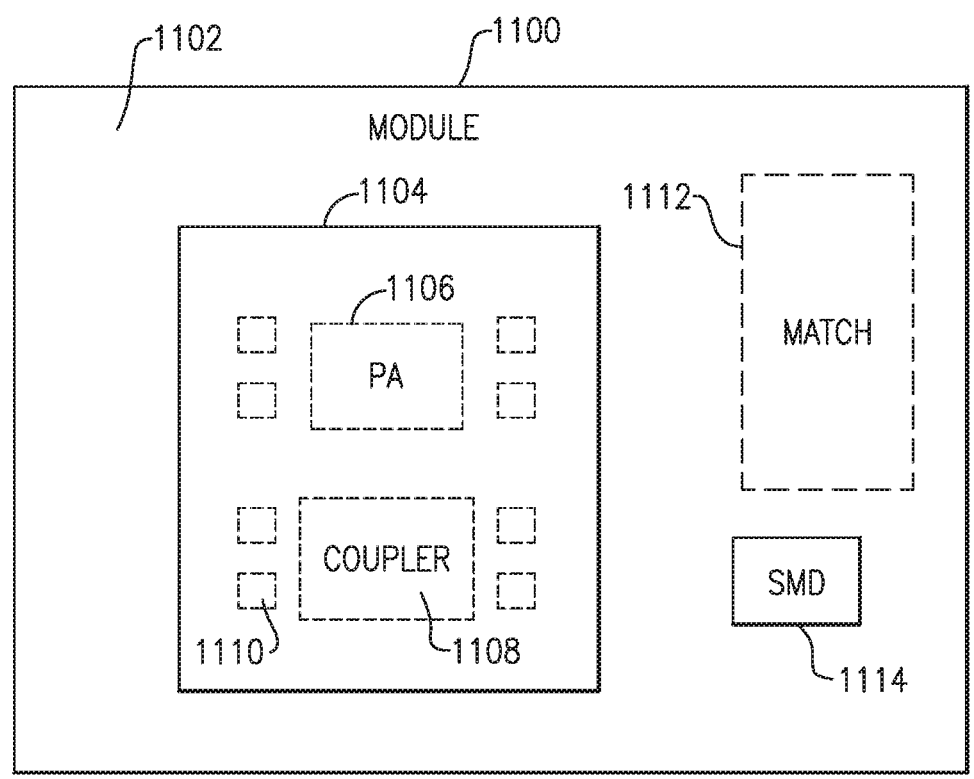
FIG. 11 illustrates an electronic module including an embodiment of a cascode amplifier circuit.

Embodiments described herein can be implemented in a variety of different modules including, for example, a front-end module, an impedance matching module, an antenna tuning module, an antenna switch module, or the like. FIG. 11 illustrates one example of a module 1100 that can include any of the embodiments or examples of the cascode amplifier 100 disclosed herein. Module 1100 has a packaging substrate 1102 that is configured to receive a plurality of components, for example, die 1104. In some embodiments, the die 1104 can include a power amplifier (PA) circuit 1106 including one or more embodiments of a cascode amplifier 100 as disclosed herein and a coupler 1108, or other RF components or circuitry known in the art, for example a switch, or filter. A plurality of connection pads 1110, for example, solder or gold bumps or posts can facilitate electrical connections to bond pads (not shown) on the substrate 1102 to facilitate passing of various power and signals to and from the die 1104.

In some embodiments, other components can be mounted on or formed on the packaging substrate 1102. For example, one or more surface mount devices (SMD) 1114 and one or more matching networks 1112 can be implemented. In some embodiments, the packaging substrate 1102 can include a laminate substrate.

In some embodiments, the module 1100 can also include one or more packaging structures to, for example, provide protection and facilitate easier handling of the module 1100. Such a packaging structure can include overmold material formed over the packaging substrate 1102 and dimensioned to substantially encapsulate the various circuits and components thereon, for example, die 1104.

Embodiments of the module 1100 may be advantageously used in a variety of electronic devices. Examples of the electronic devices can include, but are not limited to, consumer electronic products, parts of the consumer electronic products, electronic test equipment, cellular communications infrastructure such as a base station, etc. Examples of the electronic devices can include, but are not limited to, a mobile phone such as a smart phone, a telephone, a television, a computer monitor, a computer, a modem, a hand held computer, a laptop computer, a tablet computer, an electronic book reader, a wearable computer such as a smart watch, a personal digital assistant (PDA), a microwave, a refrigerator, an automobile, a stereo system, a DVD player, a CD player, a digital music player such as an MP3 player, a radio, a camcorder, a camera, a digital camera, a portable memory chip, a health care monitoring device, a vehicular electronics system such as an automotive electronics system or an avionics electronic system, a washer, a dryer, a washer/dryer, a peripheral device, a wrist watch, a clock, etc. Further, the electronic devices can include unfinished products.

Figure 12:
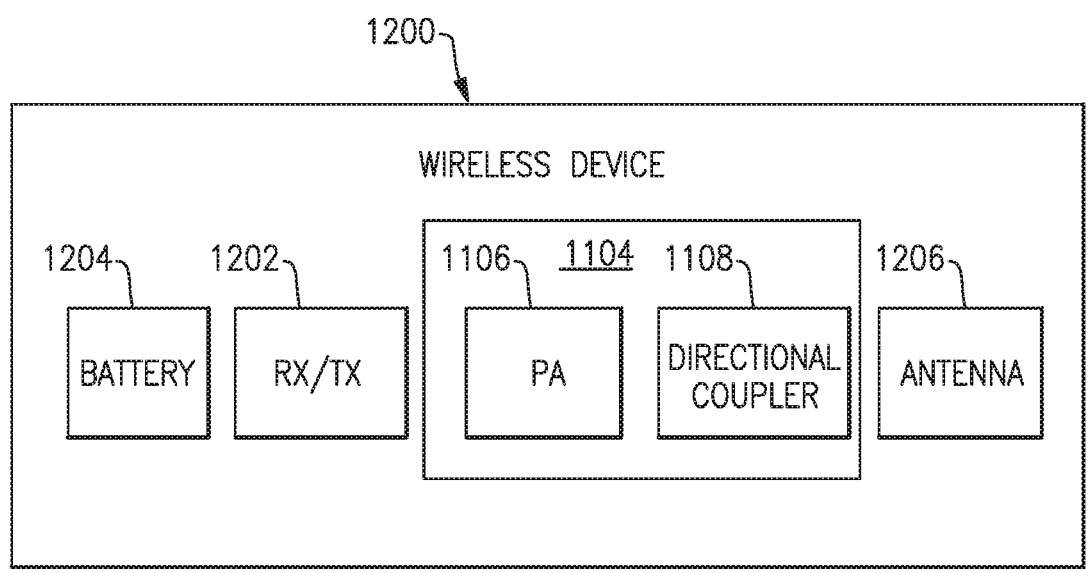
FIG. 12 illustrates a wireless device including an embodiment of a cascode amplifier circuit.

FIG. 12 is a block diagram of a wireless device 1200 including a flip-chip mounted die 1104 according to certain embodiments. The wireless device 1200 can be a cellular phone, smart phone, tablet, modem, communication network or any other portable or non-portable device configured for voice and/or data communication. The wireless device 1200 includes an antenna 1206 that receives and transmits power signals and a coupler 1108 that can use a transmitted signal for analysis purposes or to adjust subsequent transmissions. For example, the coupler 1108 can measure a transmitted RF power signal from the power amplifier (PA) 1106, which amplifies signals from a transceiver 1202. Coupler 1108 and PA 1106 may be included in a common die 1104. The transceiver 1202 can be configured to receive and transmit signals in a known fashion. As will be appreciate by those skilled in the art, the power amplifier 1106 can be a power amplifier module including one or more power amplifiers each of which including one or more cascode amplifiers as disclosed herein. The wireless device 1200 can further include a battery 1204 to provide operating power to the various electronic components in the wireless device.

Figure 13:
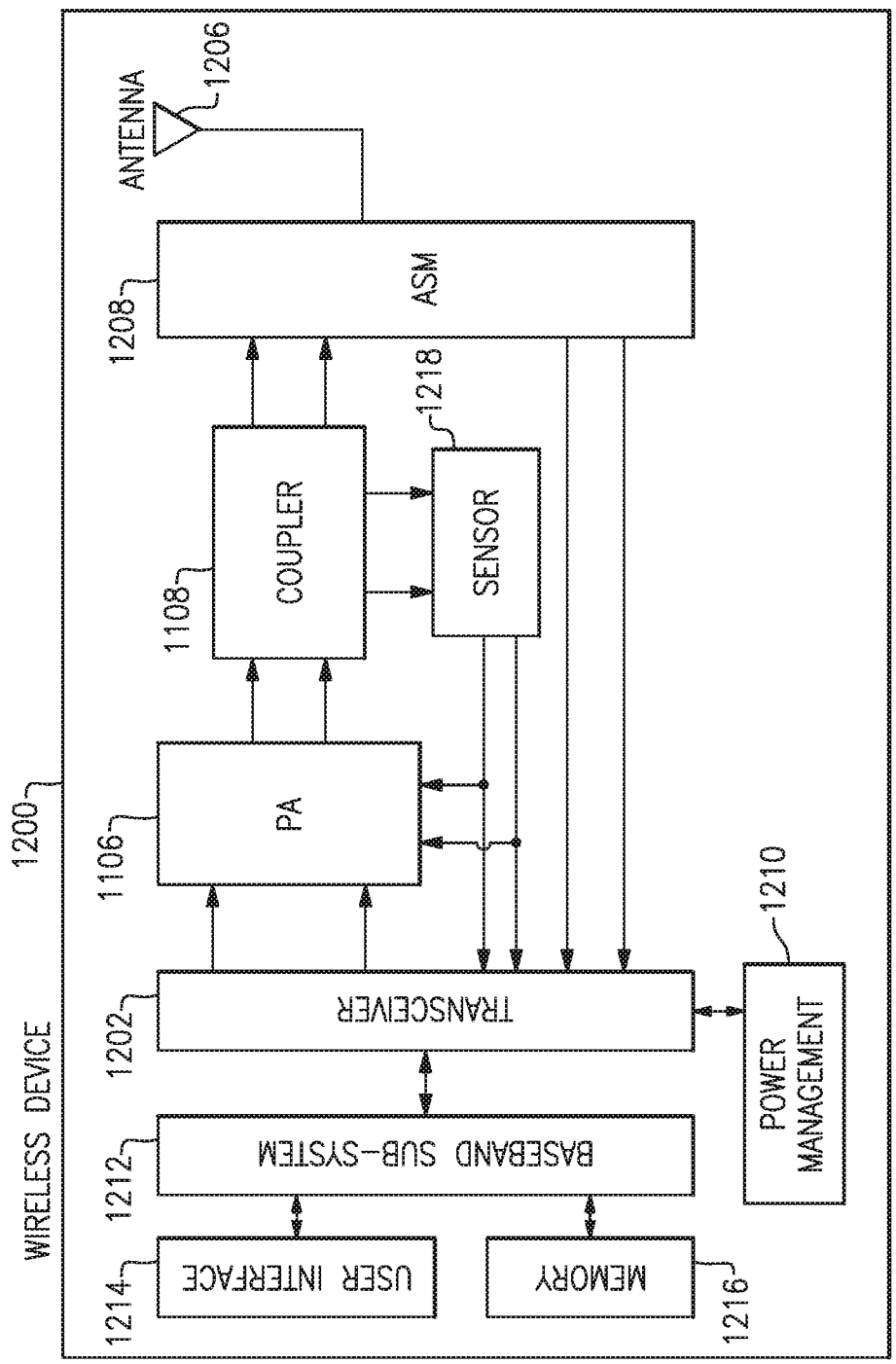
FIG. 13 is a more detailed illustration of the wireless device of FIG. 12.

FIG. 13 is a more detailed block diagram of an example of the wireless device 1200. As shown, the wireless device 1200 can receive and transmit signals from the antenna 1206. The transceiver 1202 is configured to generate signals for transmission and/or to process received signals. Signals generated for transmission are received by the power amplifier (PA) 1106, which amplifies the generated signals from the transceiver 1202. In some embodiments, transmission and reception functionalities can be implemented in separate components (e.g. a transmit module and a receiving module), or be implemented in the same module. The antenna switch module 1208 can be configured to switch between different bands and/or modes, transmit and receive modes, etc. As is also shown in FIG. 13, the antenna 1206 both receives signals that are provided to the transceiver 1202 via the antenna switch module 1208 and also transmits signals from the wireless device 1200 via the transceiver 1202, the PA 1106, the coupler 1108, and the antenna switch module 1208. However, in other examples multiple antennas can be used.

The wireless device 1200 of FIG. 13 further includes a power management system 1210 that is connected to the transceiver 1202 that manages the power for the operation of the wireless device. The power management system 1210 can also control the operation of a baseband sub-system 1212 and other components of the wireless device 1200. The power management system 1210 provides power to the wireless device 1200 via the battery 1204 (FIG. 12) in a known manner, and includes one or more processors or controllers that can control the transmission of signals and can also configure the coupler 1108 based upon the frequency of the signals being transmitted, for example.

In one embodiment, the baseband sub-system 1212 is connected to a user interface 1214 to facilitate various input and output of voice and/or data provided to and received from the user. The baseband sub-system 1212 can also be connected to memory 1216 that is configured to store data and/or instructions to facilitate the operation of the wireless device, and/or to provide storage of information for the user.

The power amplifier 1106 can be used to amplify a wide variety of RF or other frequency-band transmission signals. For example, the power amplifier 1106 can receive an enable signal that can be used to pulse the output of the power amplifier to aid in transmitting a wireless local area network (WLAN) signal or any other suitable pulsed signal. The power amplifier 1106 can be configured to amplify any of a variety of types of signal, including, for example, a Global System for Mobile (GSM) signal, a code division multiple access (CDMA) signal, a W-CDMA signal, a Long Term Evolution (LTE) signal, or an EDGE signal. In certain embodiments, the power amplifier 1106 and associated components including switches and the like can be fabricated on GaAs substrates using, for example, pHEMT or BiFET transistors, or on a silicon or SOI substrate using CMOS transistors.

Still referring to FIG. 13, the wireless device 1200 can also include a coupler 1108 having one or more directional EM couplers for measuring transmitted power signals from the power amplifier 1106 and for providing one or more coupled signals to a sensor module 1218. The sensor module 1218 can in turn send information to the transceiver 1202 and/or directly to the power amplifier 1106 as feedback for making adjustments to regulate the power level of the power amplifier 1106. In this way the coupler 1108 can be used to boost/decrease the power of a transmission signal having a relatively low/high power. It will be appreciated, however, that the coupler 1108 can be used in a variety of other implementations.

In certain embodiments in which the wireless device 1200 is a mobile phone having a time division multiple access (TDMA) architecture, the coupler 1108 can advantageously manage the amplification of an RF transmitted power signal from the power amplifier 1106. In a mobile phone having a time division multiple access (TDMA) architecture, such as those found in Global System for Mobile Communications (GSM), code division multiple access (CDMA), and wideband code division multiple access (W-CDMA) systems, the power amplifier 1106 can be used to shift power envelopes up and down within prescribed limits of power versus time. For instance, a particular mobile phone can be assigned a transmission time slot for a particular frequency channel. In this case the power amplifier 1106 can be employed to aid in regulating the power level of one or more RF power signals over time, so as to prevent signal interference from transmission during an assigned receive time slot and to reduce power consumption. In such systems, the coupler 1108 can be used to measure the power of a power amplifier output signal to aid in controlling the power amplifier 1106, as discussed above. The implementation shown in FIG. 13 is exemplary and non-limiting. For example, the implementation of FIG. 13 illustrates the coupler 1108 being used in conjunction with a transmission of an RF signal, however, it will be appreciated that coupler 1108 can also be used with received RF or other signals as well.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled," as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Directional terms such as "above," below," "left," "right," etc. are used herein as a matter of convenience for referencing various surfaces and orientations of features disclosed herein. There directional terms do not imply that the aspects and embodiments disclosed herein are necessarily oriented in any particular orientation. Any dimensions provided in the above disclosure are meant as examples only and are not intended to be limiting.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while acts of the disclosed processes are presented in a given order, alternative embodiments may perform routines having acts performed in a different order, and some processes or acts may be deleted, moved, added, subdivided, combined, and/or modified. Each of these processes or acts may be implemented in a variety of different ways. Also, while processes or acts are at times shown as being performed in series, these processes or acts may instead be performed in parallel, or may be performed at different times.

The teachings of the invention provided herein can be applied to other systems, not necessarily the system described above. The elements and acts of the various embodiments described above can be combined to provide further embodiments.

Having thus described several aspects of at least one embodiment of this invention, it is to be appreciated various alterations, modifications, and improvements will readily occur to those skilled in the art. Any feature described in any embodiment may be included in or substituted for any feature of any other embodiment. Such alterations, modifications, and improvements are intended to be part of this disclosure, and are intended to be within the scope of the invention. Accordingly, the foregoing description and drawings are by way of example only.

What is claimed is:

1. A cascode amplifier including a common-source device and a common-gate device comprising doping profiles formed by performing ion implantation of a well of the common-source device with one or more of a different ionic species, a different dosage, a different energy, or a different tilt angle than a corresponding ion implantation of a well of the common-gate device.

2. The cascode amplifier of claim 1 wherein one of the common-source device and common-gate device has a gate oxide with a different thickness than a gate oxide of the other of the one of the common-source device and common-gate device.

3. The cascode amplifier of claim 1 wherein one of the common-source device and common-gate device has a gate oxide thickness proximate a drain of the one of the common-source device and common-gate device that is thicker than the gate oxide thickness proximate a source of the one of the common-source device and common-gate device the gate oxide having a flat lower surface extending across an entirety of the gate oxide and a tapered region extending across only a portion of the gate oxide.

4. The cascode amplifier of claim 1 having a doping profile on a source side of a well of one of the common-source device and common-gate device that is asymmetric with respect to a drain side of the well of the one of the common-source device and common-gate device.

5. The cascode amplifier of claim 1 wherein a doping profile of one of a source, a drain, or the well of the common-source device is different than a doping profile a corresponding one of a source, a drain, or well of the common-gate device.

6. A module for an electronic device including the cascode amplifier of claim 1.

7. The electronic device including the module of claim 6.

8. A radio frequency device including the module of claim 6.

9. The cascode amplifier of claim 1 wherein one of the common-source device and common-gate device has a gate oxide having a flat lower surface extending across an entirety of the gate oxide, a first flat upper surface extending across only a first portion of the gate oxide, a second flat upper surface extending across only a second portion of the gate oxide, and a tapered region disposed between and extending from the first flat upper surface to the second flat upper surface.

10. The cascode amplifier of claim 1 wherein one of the common-source device and common-gate device has a tapered gate oxide and the other of the common-source device and common-gate device does not have a tapered gate oxide.

11. The cascode amplifier of claim 1 having a doping profile on a source side of a well of the common-source device that is asymmetric with respect to a drain side of the well of the common-source device.

12. The cascode amplifier of claim 1 wherein one of the common-source device and common-gate device includes a dopant that reduces a growth rate of silicon oxide relative to the growth rate of silicon oxide in the one of the common-source device and common-gate device absent the dopant.

* * * * *

UNITED STATES PATENT AND TRADEMARK OFFICE
CERTIFICATE OF CORRECTION

PATENT NO. : 10,886,382 B2
APPLICATION NO. : 15/894037
DATED : January 5, 2021
INVENTOR(S) : Yun Shi et al.

It is certified that error appears in the above-identified patent and that said Letters Patent is hereby corrected as shown below:

In the Claims

Column 12, Line 64, Claim number 3, delete "common-gate device the gate" and insert
-- common-gate device, the gate --.

Signed and Sealed this
Sixteenth Day of February, 2021

Drew Hirshfeld
*Performing the Functions and Duties of the*
*Under Secretary of Commerce for Intellectual Property and*
*Director of the United States Patent and Trademark Office*